United States Patent [19]

Powell et al.

[11] Patent Number: 5,518,674
[45] Date of Patent: May 21, 1996

[54] METHOD OF FORMING THIN FILM FLEXIBLE INTERCONNECT FOR INFRARED DETECTORS

[75] Inventors: Donald A. Powell, Richardson; Susan V. Bagen, Dallas, both of Tex.

[73] Assignee: Texas Instruments Incorporated, Dallas, Tex.

[21] Appl. No.: 950,551

[22] Filed: Sep. 25, 1992

Related U.S. Application Data

[62] Division of Ser. No. 723,343, Jun. 28, 1991, abandoned.

[51] Int. Cl.⁶ .................................................. C04B 35/00
[52] U.S. Cl. ...................... 264/104; 264/139; 264/255; 264/317
[58] Field of Search ........................ 264/104, 255, 264/317, 139; 156/665

[56] References Cited

U.S. PATENT DOCUMENTS

| | | | |
|---|---|---|---|
| 4,480,288 | 10/1984 | Gazdik et al. | 361/398 |
| 4,709,468 | 12/1987 | Wilson | 437/209 |
| 4,770,897 | 9/1988 | Wu | 437/228 |
| 5,151,388 | 9/1992 | Bakhit et al. | 437/209 |

*Primary Examiner*—Christopher A. Fiorilla
*Attorney, Agent, or Firm*—René E. Grossman; Richard L. Donaldson

[57] ABSTRACT

A method of forming an interconnect including the steps of providing a processing substrate, adhering a first electrically insulating layer to the substrate, forming an electrically conductive pattern on the first electrically insulating layer, forming a second electrically insulating layer adhered to the first electrically insulating layer with the electrically conductive pattern between the first and second electrically insulating layers, forming connections to the pattern and then removing the adhered first and second electrically insulating layers and the electrically conductive pattern from the substrate to provide a freestanding film.

16 Claims, 3 Drawing Sheets

METHOD OF FORMING THIN FILM FLEXIBLE INTERCONNECT FOR INFRARED DETECTORS

This application is a division of application Ser. No. 07/723,343, filed Jun. 28, 1991, now abandoned.

BACKGROUND OF THE INVENTION

1. Field of the Invention

This invention relates to an interconnect structure and method of interconnecting an infrared detector to external circuitry and, more specifically, to a thin film flexible electrical lead structure for use as the detector interconnect in a detector system.

2. Brief Description of the Prior Art

An interconnect is a multilayer thin film structure fabricated by conventional semiconductor processing techniques. The interconnect structure includes alternating layers of electrically insulating and conductive materials. Vias in the insulating material provide electrical connections between the conductor layers and bond pad terminations on semiconductor devices. The number of conductor layers depends on the signal routing, grounding and shielding requirements for the interconnect.

In the case of an interconnect for an infrared detector, for example, the number of conductors in the interconnect can vary from one to several hundred, depending upon the detector. Some detectors have only a few elements, each element being connected to an input and output lead to transmit the detector analog signal. Other detectors have many thousands of elements and have a multiplexing capability integrated with the detector. The latter is often referred to as a focal plane array (FPA). FPAs require not only analog signal leads, but also leads for bias and timing of the multiplexer. In all cases, the interconnect is a vital link in the IR sensor video chain. It is implicit that the interconnect conductors have resistance, capacitance and inductance and it is imperative that these parameters not exceed the limits required for high data transmission rates and low level signals.

Electrical criteria are not the only factors influencing interconnect design. Detectors, and especially infrared detectors of the type primarily referred to herein operate at cryogenic temperatures, usually about 77° Kelvin (−320° Fahrenheit). Accordingly, one end of the interconnect will generally terminate at a region which is at about 77° Kelvin while the other end thereof will be at ambient temperature or the like in the vicinity of 300° Kelvin. The interconnect thus conducts heat to the detector and increases the cooling energy required to maintain the detector at 77° Kelvin. A thermally efficient system therefore requires that the heat leak through the interconnect be minimized. This implies small cross-sectional area conductors.

Cooldown time is another thermal issue. Some sensors require that the detector be cooled from room temperature to 77° Kelvin in seconds. This is achieved by minimizing the mass to be cooled, i.e., minimizing the thermal inertia. Since the interconnect also requires cooling, it contributes to the overall thermal inertia. An interconnect with negligible or minimal mass is therefore desired.

Vacuum compatibility is yet another criterion. Typically, the IR detector and the interconnect are contained in a vacuum cell that provides insulation from the outside world. To meet performance goals, pressure in the cell typically cannot exceed one ten thousandth ($10^{-4}$) of an atmosphere. Volatile and hygroscopic materials, such as organics and non-metallics, can contaminate the vacuum cell by the process of outgassing. Thus, the interconnect should be constructed of low outgassing materials.

In accordance with one type of prior art, each detector element is individually connected to external circuitry using soldered wires or compression bonding. This is feasible when only a few detectors are present and is time consuming, cumbersome and thermally inefficient for large detector arrays.

U.S. Pat. No. 4,059,764 describes a means for metallizing leads on a non-conductive carrier such as glass. This method was further refined and became the foundation for Common Module detectors as set forth in U.S. Pat. No. 3,851,173. It is a thermally efficient method for providing several hundred electrical leads on a cylindrical surface. The drawbacks to this approach are manufacturing complexity and thermal mass. Achieving the fine geometry leads needed for multi-element arrays requires sophisticated and specialized process equipment. Also, the mass of a glass carrier structure is prohibitively high for fast cooldown sensors.

A variation on this approach uses individual wires embedded on the circumference of a cylindrical glass carrier. This technique is simpler than the evaporated metal approach, but does not achieve the lead density required for complex detector arrays. Also, it does not solve the excessive thermal mass problem.

Flexible interconnect cables have been widely used in IR Dewars. For example, U.S. Pat. No. 4,645,931 discusses two techniques for making a cable that bundles together multiple electrical leads on polymeric film. The first technique imbeds individual wires into the film. The second technique bonds a metal foil to the film, then defines the lead pattern using photolithography.

While the concept of a flexible interconnect is sound, several problems are posed by the manufacturing techniques described above. First, neither technique achieves the thermal efficiency goals required for modern detectors because the lead geometries cannot be made sufficiently small to restrict the flow of heat through the interconnect electrical conductors. Second, the various layers which make up the cable must be bonded together with epoxy, thereby promoting a large surface area for outgassing. Third, each layer of film is relatively thick, on the order of 50 to 100 microns. Since many film materials are hygroscopic, a significant volume of water absorbing material can be present, further contributing to outgassing problems. An improvement on this method uses an electroplate process to define the interconnect. However, the small cross-section geometries required for modern applications cannot be obtained.

A still further prior art method of providing flexible interconnects is set forth in U.S. Pat. No. 4,709,468 wherein a polymer/conductor multilevel film is cast on a substrate, a template having holes adapted to receive an integrated circuit in alignment with corresponding locations of the template is provided and maintained, the integrated circuit is affixed to the film and the film and integrated circuit are then removed from the substrate.

SUMMARY OF THE INVENTION

In accordance with the present invention, there is provided an improved electrical interconnect which meets the electrical, thermal and vacuum compatibility goals for packaging state of the art IR detectors. Primarily, the interconnect provides adequate electrical conductance to accommodate high data transmission rates, yet minimizes thermal conduction losses and outgassing.

The interconnect is a multilayer thin film structure fabricated by conventional semiconductor processing techniques. The structure consists of alternating layers of electrically insulating and conductive materials. Vias in the insulating material provide electrical connections between the conductor layers and bond pad terminations. The number of conductor layers depends upon the signal routing, grounding and shielding requirements for the interconnect.

The interconnect is fabricated on a standard semiconductor wafer-size processing substrate. Silicon, ceramic or polished metals can be used as the processing substrate. The electrically insulating layer is formed by casting an appropriate polymer dielectric material, such as polyimide, onto the substrate. This dielectric material must provide adequate mechanical properties, such as tensile strength, thermal expansion and low outgassing as well as acceptable electrical properties to meet the specific design requirements for the interconnect.

The electrically conductive metal layer is deposited by conventional semiconductor processing techniques, such as thin film evaporation, sputtering or plating. The metal is patterned using photolithography and either additive (lift-off processes) or subtractive (etching) processes. Through these techniques, each lead is individually tailored to a precise size and cross-section for the specific design.

A second layer of dielectric is then cast over the previously deposited dielectric and the patterned conductor layer. Vias extending through the second dielectric layer to the conductor layer are formed through a suitable mask in a standard manner such as wet etching, plasma or reactive ion etching, or laser ablation. A subsequent metal conductor layer then deposited will make electrical connections to the previously deposited conductor layer through these vias in the dielectric. This metal conductor layer is appropriately patterned to provide additional signal routing, grounding, shielding or bond pad terminations. If additional dielectric and conductor layers are desired, they can be achieved by sequentially repeating the deposition and patterning techniques discussed above.

Once the multilayer interconnect structure is complete, it is removed from the processing substrate to yield a freestanding film. Removal of the interconnect from the substrate can be accomplished by several different methods including use of a separating agent or release layer, or chemically etching the substrate away. In a variation of this process, the substrate is first selectively scribed and sawed or etched from the backside to remove only portions of the substrate. The resulting structure is then flexible film interconnects inherently attached at each end to rigid carriers cut from the substrate.

The completed interconnect is then electrically coupled at one end thereof to the electronic circuitry of the IR detector and at the other end thereof to the external electronics. Variations in the processing sequence used to fabricate the interconnect can accommodate a number of different techniques to accomplish this coupling or assembly. Wire bonding, solder reflow, thermal compression/ultrasonic or laser bonding can all be used, depending upon the type of metal used, for bond pad terminations and the stackup of the multilayer structure.

Using the interconnect of the present invention, an improved means for electrically connecting an IR detector to external circuitry is achieved. Since standard semiconductor processing is used, the thin film interconnect structure can easily be on the order of 10 to 25 micrometers total thickness. Both the mass and the outgassing of the organic dielectric are, therefore, greatly minimized, thereby enhancing vacuum integrity. Using photolithography to produce very fine geometry lead patterns in thin film metal results in an interconnect which provides only the precise amount of electrical conductivity needed in each conductor for optimum performance, yet greatly minimizes thermal conduction losses between the ambient external electronics and the cryogenically cooled IR detector.

Briefly and more specifically, the interconnect is fabricated by depositing a pattern of electrically conductive metal leads onto a film of electrically insulating material. This electrically insulating or dielectric material must provide adequate mechanical properties, such as tensile strength and thermal expansion, as well as acceptable electrical properties to meet the specific design requirements for the interconnect. The resistivity required and specific dielectric used will depend upon the particular application. Any polymer materials which have high mechanical strength, low dielectric constant (<3.5), and good thermal stability are candidates. Examples of such materials are polyimides, polytetrafluoroethylene and benzocyclobutenes. A release layer material, such as Brewer Science PiRL, can optionally be coated prior to depositing the polyimide to assist removal from the substrate (to be discussed hereinbelow). The Brewer Science PiRL is described in an article entitled 'A Novel Release Layer System For IC Processing' by T. D. Flaim et al. The electrically insulating material, which is preferably a polyimide, such as, for example, DuPont Pyralin, is cast on a processing substrate such as, for example, silicon or aluminum, in a very thin film, on the order of from about 5 to about 25 microns and preferably about 7 microns after cure. Since the interconnect film is very thin, the processing substrate provides the structure required to retain the film in a flat state to permit patterning thereon by metal film deposition and photolithography. By using a standard semiconductor wafer-size processing substrate, the interconnect manufacturing process can be performed on commercially available automated semiconductor processing equipment.

The polyimide layer is initially dispensed and spun onto the processing substrate using standard semiconductor fabrication techniques. The polyimide is then cured and a layer of electrically conductive metal is then deposited onto the insulating polyimide layer. Depending upon the primary conductor material chosen, alternative materials under and above this layer may be necessary for adhesion to the polyimide base layer and/or cover layer. Since the materials chosen for these adhesive layers are often high stress metals, such as Ni, TiW, Cr, Ta and the like, a thicknesses in the range of 500 to 1000 Angstroms can be used. The electrically conductive layer is typically alternate layers of chromium, then copper and then chromium having thicknesses of about 1K, about 7.5K and about 1K Angstroms respectively. Aluminum, titanium/tungsten, gold, nichrome or any other thin film deposited electrically conductive metal or alloy can be used. Thicknesses are regulated to meet electrical and structural requirements.

The electrically conductive layer is then patterned to provide a plurality of conductors on the insulating layer in standard manner and then a second layer of electrically insulating material, preferably a polyimide, having a thickness of from about 5 microns to about 25 microns and preferably about 7 microns is spun over the previously deposited electrically insulating layer and the electrically conductive pattern thereon. Vias extending through the second electrically insulating layer to the electrically conductive pattern are then formed through a suitable mask in standard manner, such as by reactive ion etch (RIE), to expose the electrically conductive patterned leads. An electrically conductive metal is then deposited in the vias so that this metal contacts the electrically conductive pattern, this metal preferably being deposited by sputtering. The electrically conductive metal with good adhesion to the dielectric such as metal lead sandwich typically consist of chromium having a thickness of about 1K Angstroms over which is a layer of copper having a thickness of about 10 Angstroms. As stated above, instead of Cr, Ni, TiW or Ta can also be used with thicknesses minimized. A solder bump is then formed over the metal layer, preferably by plating a layer of copper thereover having a thickness of about 12 microns followed by a layer of 60/40 Sn/Pb solder having a thickness of about 25 microns. Other materials which can be used are plated (3 to 12 micrometers) or sputtered (about 3 micrometers) gold or sputtered (2 to 3 micrometers) aluminum for wire bonding. The film with deposited interconnect pattern is then removed from the processing substrate with a solvent which will dissolve the release layer, such as, for example, Brewer Science Release Solution A1, or by placing the substrate with interconnect thereon into boiling water if no release layer was used. The pattern will lift off of the substrate in the case of a silicon substrate and polyimide film because this degrades the adhesion.

The completed interconnect is then flow soldered or otherwise electrically coupled in standard manner at one end to electronic circuitry such as the FPA which is ultimately disposed in a vacuum chamber at about 77° Kelvin. The other end of the interconnect is electrically coupled to electronic circuitry generally remote from the vacuum chamber which is at higher temperature, such as ambient room temperature, which routes the signals to the external environment.

In accordance with a second embodiment of the invention, an etchable electrically conducting processing substrate, preferably aluminum, is used with the via of the above described embodiment being replaced by metal build-up resulting from actual plating steps during the processing of the interconnect. After the entire interconnect has been fabricated on the processing substrate, the substrate is etched away, leaving only the flexible, thin interconnect with a through metal via.

In accordance with a third embodiment of the invention, a lead metallization pattern can be formed, as desired, on both sides of the process substrate by standard semiconductor subtractive or additive wafer processing. When a patterned substrate is not required, a thin metallization layer, such as TiW, Ni, Al or Cr is deposited prior to spinning the polyimide onto the process substrate to provide adequate adhesion between the interconnect and the substrates in any desired region. Alternatively, in the case where the process substrate is metal, the backside can be appropriately masked and the metal can be chemically etched away in selected areas to produce the flexible interconnect structure. Backside metallization on the process substrate allows the completed structure to be attached to the IR package by conventional die attachment techniques such as soldering. The interconnect may then be processed in the manner described above. Vias may be formed utilizing the process steps described above when electrical connection to the process substrate metallization pattern is required. Once interconnect fabrication has been completed, the substrate is scribed or selectively etched to remove portions thereof before removal of the film and removal techniques, such as those described above, may be employed to uncouple the polyimide from the process substrate in areas which are to become the flexible structure. Areas with metallization or lacking releasing agent will remain coupled to the process substrate, resulting in the IR detector mount, warm end termination carriers and interconnect being inherently attached to each other.

DESCRIPTION OF THE PREFERRED EMBODIMENTS

Figure 1:
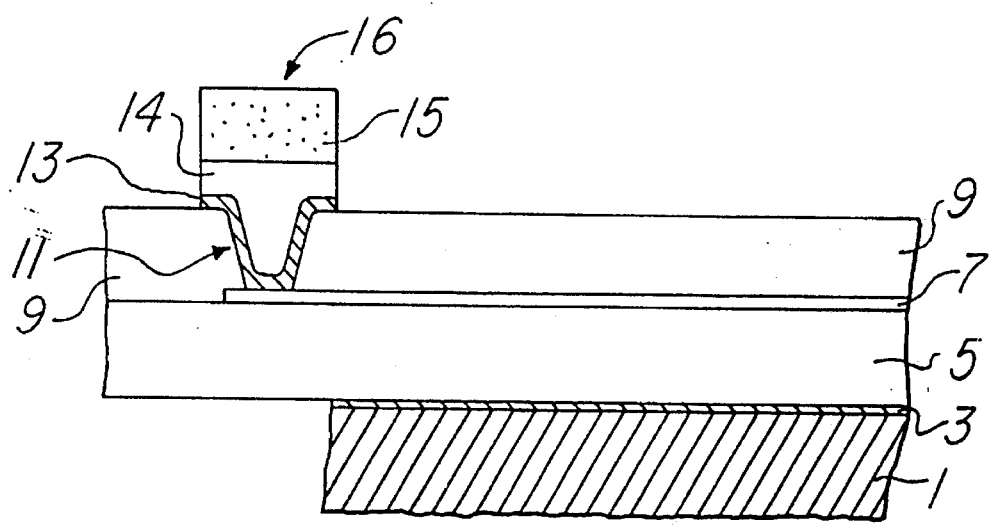
FIG. 1 is a cross sectional view of a thin film polyimide interconnect solder reflow structure on a processing substrate in accordance with a first embodiment of the present invention.

Referring first to FIG. 1, there is shown an interconnect in accordance with a first embodiment of the present invention. There is shown a silicon processing substrate or wafer 1. Silicon is a convenient and inexpensive material choice for the process substrate because it lends itself to use in conjunction with standard semiconductor processing equipment. The substrate may, however, be of any material which provides mechanical support for the interconnect during fabrication and is inert to the processing steps involved.

A layer of silicon dioxide 3 can be deposited or formed on the substrate 1 in standard manner to provide a process surface with uniform composition. Depending upon the type of polymer used, diluted adhesion promoter or a release layer material (e.g., Brewer Science PiRL), not shown, may be applied to the silicon dioxide surface to ensure adequate adhesion through the interconnect fabrication process. The adhesion promoter or release layer must also allow the film to be easily removed from the substrate after the interconnect processing steps are completed.

Once the substrate has been prepared, a suitable liquid polymer dielectric layer or coating (such as polyimide) 5 is applied to the substrate in standard manner, such as by spin coating. Polymer thicknesses can be regulated to customize particular strength, flexibility and dielectric properties. Thicknesses of 7 microns have been found to provide an adequate tradeoff from these criteria, though this thickness can vary. The particular polymer and process substrate chosen should have compatible thermal expansion rates to avoid excessive stress during processing. Low moisture absorption is also desirable for application in IR detector vacuum closures. Polyimide coatings provide such properties. In particular, Pyralin LX and PI-2610/11D of DuPont and L100 of Hitachi are preferred for use with silicon process substrates because their strength and moisture absorption properties are better than other polyimides presently available and their thermal expansion matches that of silicon.

Once the film is applied by any conventional technique, such as spinning or spraying, it is fully cured to achieve maximum properties. The electrically conductive leads 7 are then formed by conventional thin film deposition and photolithography techniques. Semiconductor wafer fabrication equipment is ideal for this purpose. The lead structure 7 is designed to provide a suitable compromise between lead size, resistance and heat load. Chromium/copper/chromium lead metallization provides such a compromise. Copper is the primary conductor material because its high conductivity allows very thin films to be used and still meet the electrical resistance requirements. The thin metallization layer of chromium is deposited before and after the copper deposition to provide adequate adhesion to the polyimide film. The choice of lead metallization must take into consideration this required adhesion between the polymer and the primary conductor metal. Leads are formed either by an additive process or subtractive process. A metal liftoff or additive process is desirable to ensure that no residual metallization remains after formation of the leads, which could potentially create high resistance electrical leakage between leads.

Photomask patterns may be used to tailor the lead widths to fit desired resistances for a given design length. The leads are finely adjusted to match desired resistances by regulating the thin film metal deposition thickness and material. Furthermore, lead material may be varied from conductor to conductor within an interconnect. Copper provides an efficient tradeoff between electrical resistance and thermal conduction over other materials for the 77° to 300° Kelvin temperature differential required for detector interconnect. However, any standard semiconductor lead metal, such as Ni, Al, Au, etc. can be used to form the lead structure. It should be understood that copper has both high electrical and thermal conductivity. The high thermal conductivity is undesirable because it is desired to minimize the heat load in order to maintain the IR detector at 77° K. It is for this reason that photolithography is used to individually tailor the size of each lead. In this way, each lead is sized for the precise resistance requirements required with no excess metal to contribute to the heat load. This is a key issue as to the advantage of the interconnect herein as compared with prior art technology.

An additional polyimide film 9 is then deposited to sandwich the metallized pattern 7 between insulating layers 5 and 9. It is important to note that this electrically insulated assembly can be formed without the use of epoxy. A suitable thickness must be selected for the polyimide cover layer 9 to protect the leads 7 and provide adequate mechanical strength.

Vias 11 are then formed in the second layer of polyimide 9 at opposite ends of each lead (only one shown in FIG. 1). The vias provide an electrical connection between the thin-film metal leads 7 and the metal bond pads 16. The vias 11 are formed through a suitable mask in a standard manner such as by either wet or dry chemical etching or laser ablation.

Thin film metallization 13 of slightly larger geometry than the vias 11 is deposited over the vias to inhibit contamination, provide for the improved adhesion of the pad to the surface of film 9 and provide external connection to the leads 7. This metallization layer must also itself be suitable for direct bonding or for plating up thereon an appropriate bond metal. For example, when a tin/lead solder termination is desired, a region of chromium/copper can be used. Copper can then be plated onto the region 11 to provide an adequate base to inhibit dewetting during solder reflow. A solder 15 would then be plated over the copper layer 14 to provide the completed interconnect structure.

Metal deposition, patterning of leads and via formation in the polyimide cover layer may be repeated prior to forming the bond pads, if desired, to form a multi-layer interconnect structure.

One method of creating the metal bond pad 16 is to deposit a metal shorting bar over the surface of the vias and polymer 9 to serve as the electrode. The metal bond pad 16 is plated through a conventionional photoresist pattern. For example, when a solder termination is desired, the copper layer 14 and the solder alloy layer 15 thereover are then plated. The layer of copper 14, having a thickness of about 12 microns, is therefore initially plated into the via and over the region 13 therein for this purpose. For the reflow structure, the plating material is preferably a solder alloy. Conventional lead/tin, gold and indium solder alloys may easily be plated over the copper layer for this purpose. Where allowable, other conventional techniques such as wave solder and silk screening can easily be employed instead of plating.

Removal of the interconnect structure will depend upon the processing substrate 1 used, the method of surface preparation of the substrate 1 and/or the polymer dielectric used. For example, when polyimide is used on silicon, the interconnect structure can be removed from the substrate in hot water when the substrate 1 surface preparation involved either diluted or no adhesion promoter. When the substrate surface preparation involves the use of a release layer material, such as Brewer Science PiRL, the interconnect structure is removed by soaking in an appropriate solvent which will dissolve the release layer. If a metal substrate such as aluminum is used, removal of the interconnects can be accomplished by dissolving the substrate in an appropriate etchant. Individual parts may be profiled either before or after the film has been removed from the process substrate. The profiled structure may be created by processes similar to those described for via formation. If preferred, the parts may also be incised or cut out after the entire film has been removed from the process substrate.

Once the fabrication process of the interconnect has been completed, the structure is assembled into the IR detector package.

Figure 2:
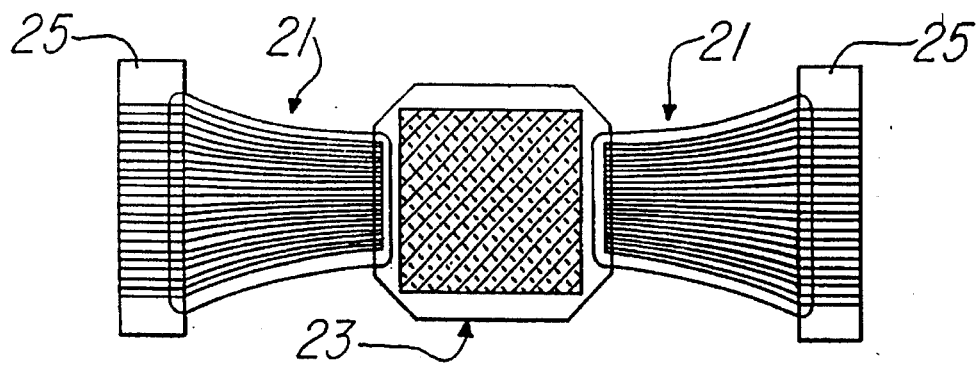
FIG. 2 is a top view of a pair of completed interconnect structures of FIG. 1 connected at one end to an IR detector mount and at the opposing end to a termination circuit.

FIG. 2 shows the completed interconnect film 21 described with reference to FIG. 1 attached at one end thereof to a patterned metallized ceramic substrate 25 with the bond pads 16 connected to the conductive leads 7 of FIG. 1 thereon connected to the metallization on the substrate 25. The other end of the interconnect film 21 is attached to metallization deposited on a ceramic substrate 23. The substrate 23 has an IR array thereon with connection therefrom to the metallization thereon. The connection between the interconnect 21 and the substrates 23 and 25 takes place between the metallization on the substrates 23 and 25 and the metal bond pads 16 on the interconnect structure (similar to a surface mount solder joint). The assembly of a solder-reflow interconnect structure can be performed by many conventional techniques. Vacuum ovens and inert gas furnaces are preferred methods since they can be performed without the aid of a flux which jeopardizes the vacuum life of the system. This reflow process is performed either before or after the film has been removed from its processing substrate 1 of FIG. 1. The completed subassembly of FIG. 2 is then installed by conventional die attachment techniques into the IR detector package with the substrate 23 in an evacuated housing at 77° Kelvin and the substrate 25 at ambient temperature. The detector may be mounted to the interconnect structure either before or after the interconnect structure is installed in the IR detector package, depending upon the process and testing requirements.

A slight variation to the process described above would replace the solder pad with a thin metal pad. For example, a gold or aluminum pad would allow wire bonding to be used as the lead termination scheme.

For this method, the interconnect must be assembled into the package with the bond pads facing up, away from the ceramic substrate. The interconnect needs to be "anchored" down from the backside onto the ceramic substrates either by epoxy or solder. When solder is chosen, backside metallization must be formed on the interconnect during the fabrication process. This metallization can be achieved when a release layer material is used as surface preparation on the silicon substrate or a metal substrate, such as aluminum, is used. The metallization is deposited on the substrate 1 before the polymer dielectric 5 is coated. Once the interconnect is anchored onto the ceramic substrates, electrical connections can be made by wire bonding from the pads on the interconnect to metallization on the ceramic substrate or directly to the pads on the IR detector.

Completed thin film interconnects can be on the order of 14 microns in thickness, forming a structure of extremely low thermal mass. The structure is sufficiently strong, yet the volume of hygroscopic materials has been minimized.

Figure 3:
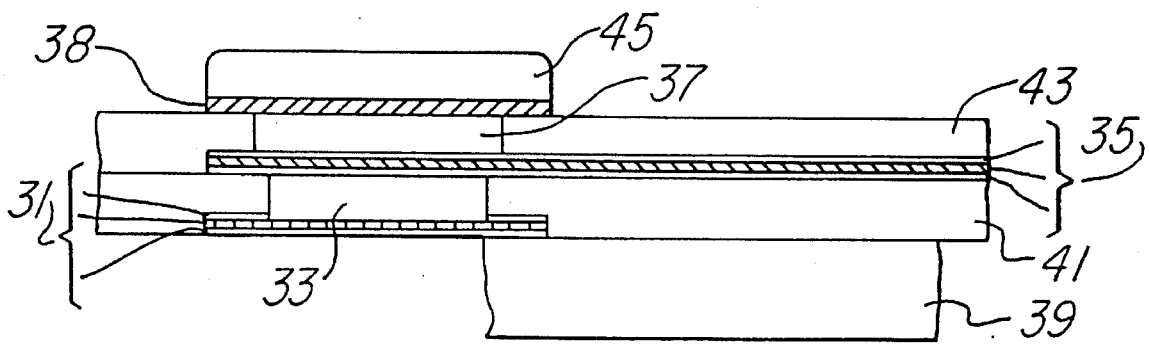
FIG. 3 is a cross sectional view of a thin film polyimide interconnect in accordance with a second embodiment of the present invention.

The interconnect process allows other versions of interconnect structures to be easily fabricated using only slightly modified techniques. When thermal compression and/or ultrasonic bonding is desired as the method of assembly, it is advantageous to fabricate a solid metal through-bump interconnect structure such as the one shown in FIG. 3. The stacked metal vias provide both a path of low thermal resistance to allow sufficient heat/ultrasonic energy transfer from the bond tool as well as adequate structural support to withstand the force of the bond tool. The solid metal via composed of a thin backside metal pad, such as TiW/Au/Ni region 31, a metal-filled via, such as plated Ni on Cu or plated Ni layer 33, lead metallization such as Cr/Cu/Ni layer 35 and another metal filled via layer 37 provides direct transfer of heat and/or ultrasonics during bonding. The solid via is completed by a layer of TiW 38 over the nickel layer 37 and a plated Au layer 45 over the TiW layer 38. As can be seen in FIG. 3, the processing substrate 39 is formed of aluminum with layers of polyimide 41 and 43 thereover with the interconnect pattern layer 35 between the polyimide layers 41 and 43 as in the prior embodiment. The processing substrate can be silicon with surface preparation using a release layer material, such as Brewer Science PiRL or a metal substrate. The interconnect pattern 35 is also connected to the layer 31 via layer 33.

An example of a fabrication sequence for the solid metal through bump approach is shown in FIGS. 4A to 4D. For this particular approach, it is advantageous to use a metallized or solid metal substrate to begin the interconnect fabrication process. The metal substrate provides a built-in shorting bar which all subsequent plating steps use. It will be apparent to one skilled in the art that this operation can save a significant number of process steps.

Figure 4A:
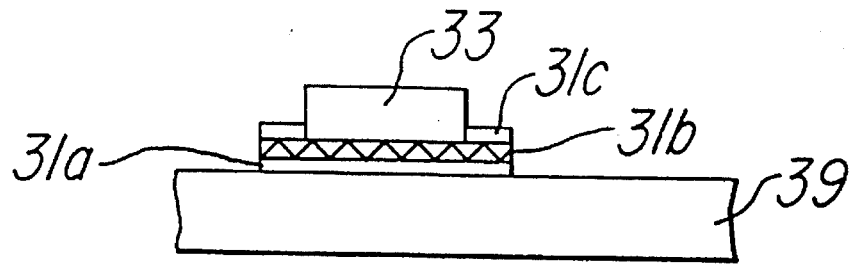
FIGS. 4A, 4B, 4C and 4D are a process flow for fabricating the interconnect of FIG. 3.
Figure 4B:
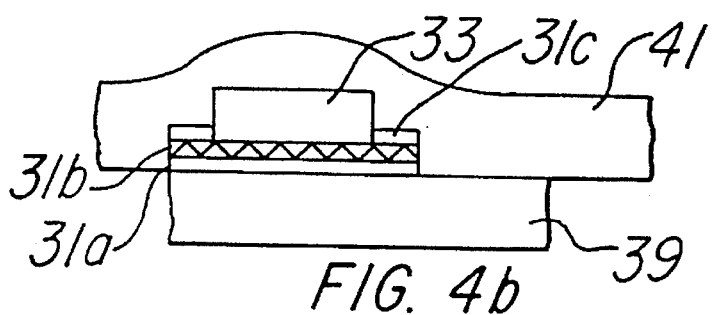
Figure 4C:
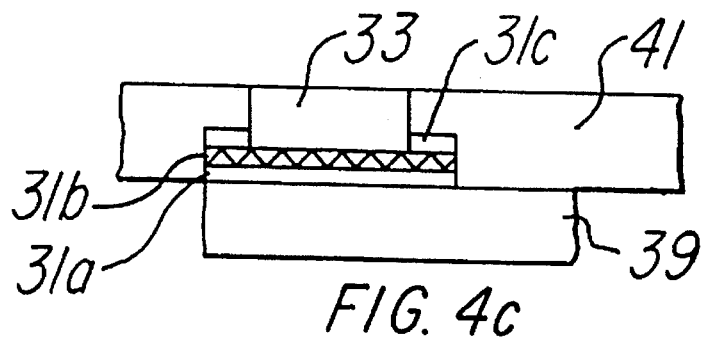
Figure 4D:
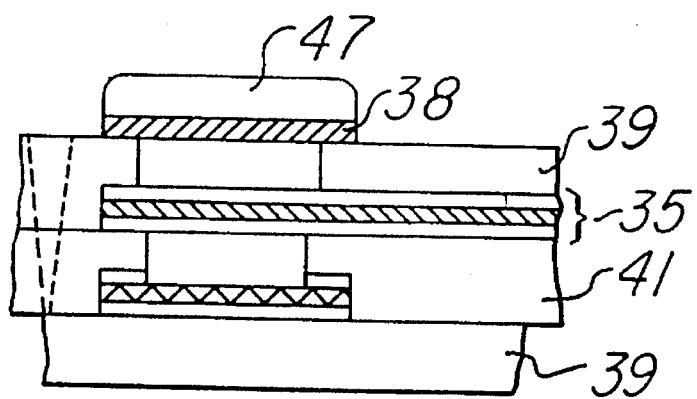

With reference to FIG. 4A, there is provided the aluminum processing support 39 onto which is initially disposed in standard manner, such as by sputter deposition, a layer of titanium tungstide (TiW) 31a having a thickness of 1K Angstroms followed by a layer of gold (Au) 31b having a thickness of 3K Angstroms and then a layer of nickel (Ni) 31c having a thickness of 1.5K Angstroms. The Ni via layer 33 is then plated onto the Ni layer 31c. A first polyimide layer 41 is then spun over the structure of FIG. 4A in standard manner as shown in FIG. 4B. The structure of FIG. 4B is then planarized to expose the metal via 33 by mechanical polishing or dry etching techniques. This is followed by deposition of the lead metallization 35, such as Cr/Cu/Ni, a repeat of the process steps discussed with respect to FIGS. 4A to 4C to form the plated nickel layer 37 and the polyimide layer 43 of FIG. 3, formation of TiW layer 38 and then the plating of the gold bond 47 as shown in FIG. 4D. The aluminum substrate is then etched back to the polyimide layer 41 to remove all of the aluminum and provide the completed interconnect film.

The metal vias shown in FIG. 4A can be plated either before or after the polyimide layers are applied, depending upon equipment availability and preference. A backside metallization pad is present to serve as a "cap" over the metal via to seal it around the polyimide, thus inhibiting delamination. The gold also protects the metal via Ni or Cu from being attacked when the metal substrate is etched away. Preferably, nickel metal vias are plated prior to application of polyimide and use of a secondary mechanical planarization step to expose the metal vias for electrical connection. The leads may be formed by a process similar to that described for the solder reflow approach above. The final interconnect structure is removed by chemically etching the process substrate 39 away.

Slight variations to the processing described herein lend themselves to many alternate methods for terminating the interconnect to provide adequate continuity for electrical transmission from an IR detector. For solder pads, FIG. 2 shows one such approach where, as shown in this FIGURE, the completed interconnect film 21 is reflowed at each end to patterned metallized ceramic substrates 23 and 25. The assembly of a solder-reflow interconnect structure can be performed by many conventional techniques. Vacuum ovens, inert gas furnaces and lasers are preferred methods since they can be performed without the aid of a flux which jeopardizes the vacuum life of the system. This reflow process is performed either before or after the film has been removed from the processing substrate 1 of FIG. 1. The completed subassembly of FIG. 2 is then installed into the IR detector package with the substrate 23 in an evacuated housing at 77° Kelvin and the substrate at ambient room temperature while in operation. Once installed, the assembly is terminated by conventional techniques to the detector and feedthrough circuitry. Alternatively, the interconnect film 21 could be attached by reflowing the solder directly to the metallization pattern on the feedthrough and detector mount without the need of an interim assembly. This alternate approach can be accomplished with the aid of sophisticated assembly tooling.

Another such variation of attachment is to use ultrasonic thermal compression or laser bonding to form an intermetallic joint between the metal pads on the interconnect film and the metallization of the substrates. This approach requires changing the pad metallization to a metal, such as gold or aluminum, capable of forming a reliable intermetallic bond. In the solid-metal via approach, where thermal and ultrasonic transfer can be easily employed, either thermal compression/ultrasonic single point or gang bonders or conventional lasers can be utilized to form the intermetallic bond. Conventional equipment, such as ball, wedge or ribbon bonders can be used to form a wire jumper from the pads to the substrate metallization.

Figure 5:
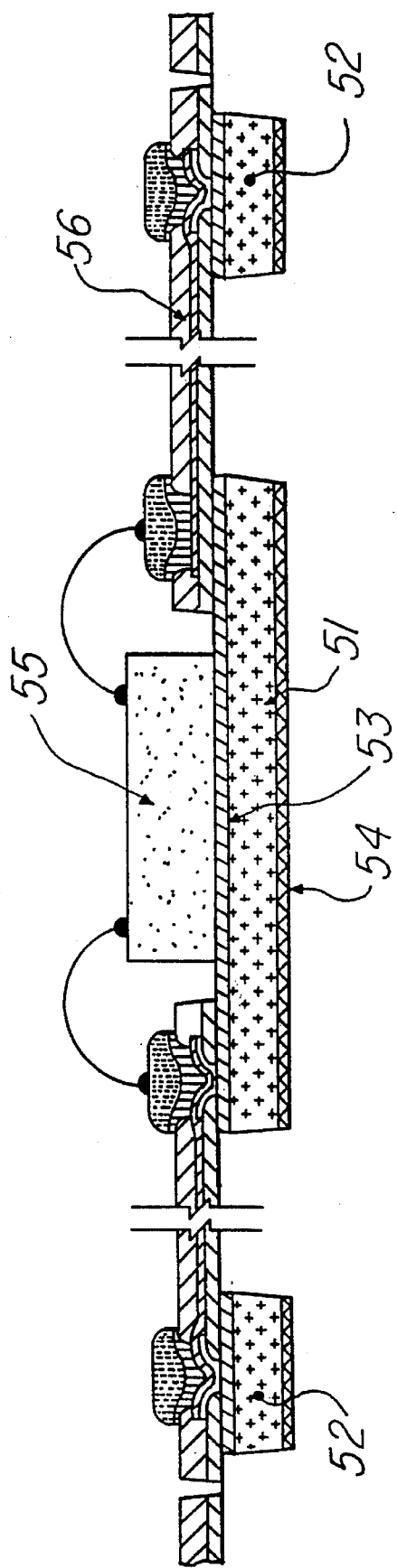
FIG. 5 is a cross sectional view in accordance with a third embodiment of the invention.

Another preferred method of interconnect manufacture, shown in FIG. 5, is to utilize the process substrate to inherently become the IR detector mount 51 and termination carrier substrates 52 while processing the interconnect. This technique provides several additional advantages over the other preferred methods described herein:

1) the process eliminates the assembly operation required to mount the interconnect to the IR detector mount and termination carrier substrates;
2) the process has the capability of electrically connecting the metallization pattern of the said substrates to the leads on the interconnect;
3) the interconnect may be concurrently manufactured with the said carriers thus reducing process time and cost;
4) the method provides an improved assembly for attachment to the IR package;
5) the assembly yields itself to a simple, testable substructure;
6) the method minimizes the mounting space required to attach the interconnect and thus reduces the mass of the IR detector mount.

Initially, a metallization pattern may be formed on both sides of the process substrate by standard semiconductor subtractive or additive wafer processing. This pattern will later become the lead routing 53 of the substrates 51 and 52. The lead metallization 53 can also serve to provide the required adhesion between the polyimide and the process substrate. When a patterned substrate is not required, a thin metallization layer 53, such as, for example, TiW, Ni, Al or Cr may be deposited prior to spinning the polyimide onto the process substrate to provide adequate adhesion between the interconnect and the substrates 51 and 52 in any desired region. Alternatively, in the case where the process substrate is metal, the backside can be appropriately masked and the metal can be chemically etched away in selected areas to produce the flexible interconnect structure.

Backside metallization 54 on the process substrate 51 allows the completed structure to be attached to the IR package 55 by conventional die attachment techniques such as soldering. The interconnect 56 may then be processed similar to that described above. Vias may be formed similar to the process steps described above and depicted in FIG. 1 and 3 when electrical connection to the process substrate metallization pattern is required. Once interconnect fabrication has been completed, similar removal techniques, as those described in hereinabove, may be employed to uncouple the polyimide from the process substrate in areas which are to become the flexible structure—areas with metallization or lacking releasing agent will remain coupled with the process substrate. The IR detector mount 23, termination carriers 25 and interconnect 21 can then be formed into a finished assembly by standard die cutting processes such as diamond sawing or laser scribing.

Figure 6:
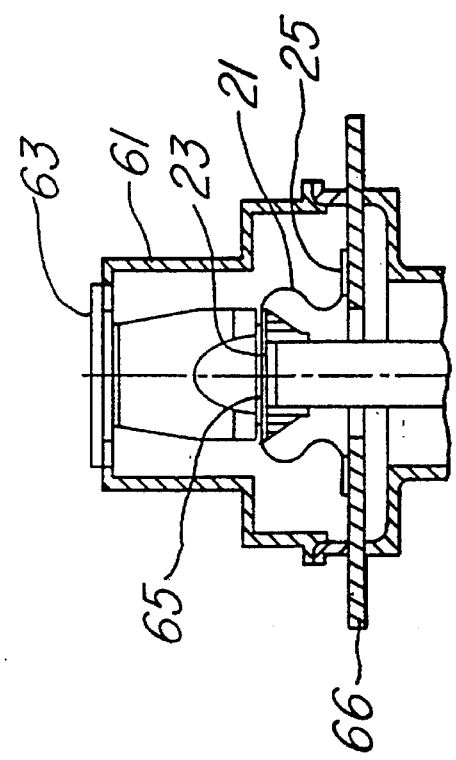
FIG. 6 is a cross sectional view of an IR detector showing the manner of assembly of the interconnect of the present invention therein.

Once the completed interconnect has been fully or partially removed from the process substrate, the interconnect is mounted in a Dewar package as shown in FIG. 6. The interconnect provides a means of forming the electrical conduit from the infrared detector 65 to the feedthrough assembly 66. The metallization pattern on the feedthrough routes the leads from inside the Dewar vacuum cell to the external environment. The preferred embodiments described herein provide several alternative methods of electrically coupling the interconnect to the feedthrough and detector metallization patterns, if desired.

In the first embodiment, solder pads are formed at the end of each lead on the interconnect. After removing the interconnect from the process substrate, the free-standing structure can be reflowed to the pad terminations of the detector and feedthrough. Alternatively, the free-standing interconnect 21 may be attached to secondary substrates 23 and 25 to form a testable substructure prior to installation into the Dewar. This structure would subsequently be installed in the Dewar to complete the pedestal to which the detector is mounted. The detector and feedthrough metallization pattern can be electrically coupled to the interconnect via the secondary substrates using conventional microelectronic packaging techniques, such as wire, ribbon or ball bonds.

As previously described in the first embodiment, alternate materials may be used to form the interconnect termination pads. When gold or aluminum is used, the backside of the free-standing interconnect may be soldered or epoxied to the carrier substrates 23 and 25 to form the subassembly. The assembly can then be electrically coupled to the detector and feedthrough metallization using wire, ribbon or ball bonds. This method also permits elimination of the secondary substrates and mounting of the interconnect directly to the detector and feedthrough.

Other means of electrically attaching the free-standing interconnect can be employed in the case of the second embodiment, where a solid metal via was produced at opposite ends of the interconnect. This structure allows sufficient thermal and mechanical transfer to occur such that the free-standing interconnect can be electrically connected to the substrates or detector with intermetallic bonds. The intermetallic bonds can be performed by standard microelectronic packaging techniques, such as single point thermosonic bonding, gang thermal compression bonding or laser reflow.

In the case of the third embodiment, in which carriers 23 and 25 are inherently attached to the interconnect, no subsequent assembly processes would be required. The completed interconnect structure would then be attached to the Dewar stem and electrically coupled to the feedthrough assembly and detector by conventional methods, such as wire, ribbon or ball bonding. The interconnect is hermetically enclosed in the Dewar package by sealing the vacuum cover 61 to the lower housing vacuum cell. The optical bundle of the infrared system focuses on the detector via the infrared window 63 which is transparent in the infrared spectrum.

There have thus been described thin film flexible interconnects for IR detectors. Relative to the prior art, the advantages of the interconnects are:

1. Significant reduction in conducted heat.
2. Compatibility with long life high vacuum packaging requirements.
3. Leads are encapsulated between insulating layers without the use of an epoxy.
4. Negligible mass.
5. An approximate fivefold reduction in thickness, e.g., volume of water absorbing material.
6. Tailored resistances to match detector data transmission requirements.
7. Compatible with a variety of end terminations.
8. Capable of providing multi-layer circuits.

Though the invention has been described with reference to specific preferred embodiments thereof, many variation and modification will immediately become apparent to these skilled in the art. It is therefore the intention that the appended claims be interpreted as broadly as possible in view of the prior art to include all such variations and modification.

We claim:

1. The method of forming a flexible electrical interconnect for interconnecting an infrared detector to circuitry comprising the steps of:
   (a) providing a processing substrate;
   (b) adhering a first electrically insulating layer to said substrate;
   (c) forming an electrically conductive pattern on said first electrically insulating layer;
   (d) forming a second electrically insulating layer adhered to said first electrically insulating layer with said electrically conductive pattern between said first and second electrically insulating layers;
   (e) forming connections to said pattern by
      (i) forming vias in said second electrically insulating layer extending to said pattern
      (ii) depositing conductive material into the vias to contact the electrically conductive pattern;
      (iii) depositing a patterned metal conductor layer onto the second electrically insulating layer and in contact with the conductive material within the vias;
      (iv) forming a metal bond pad over the patterned metal conductor layer; and
   (f) removing said adhered first and second electrically insulating layers and said electrically conductive pattern from said substrate to provide a freestanding film.

2. The method of claim 1 wherein said first layer is a polyimide.

3. The method of claim 2 wherein said pattern is a layer of chromium over a layer of copper over a layer of chromium.

4. The method of claim 3 wherein said substrate is silicon.

5. The method of claim 1 wherein said pattern is a layer of chromium over a layer of copper over a layer of chromium.

6. The method of claim 1 wherein said removal includes placing said substrate and said first layer in boiling water.

7. The method of claim 1 further including the step of placing a release layer on said substrate prior to formation of said first electrically insulating layer and said step of removing in step (f) includes placing said substrate in a solvent for said release agent.

8. The method of claim 1 wherein step (e) includes forming a layer of copper over chromium on the walls of said via and then forming a bond pad thereover extending out of said via.

9. The method of claim 1 wherein said conductive material is deposited by the step of plating of nickel contacting said conductive pattern and wherein said step of forming a bond pad includes the step of plating gold over said nickel.

10. The method of forming a flexible electrical interconnect for interconnecting an infrared detector to circuitry comprising the steps of:
   (a) providing a processing substrate;
   (b) adhering a first electrically insulating layer to said substrate;
   (c) forming an electrically conductive pattern on said first electrically insulating layer;
   (d) forming a second electrically insulating layer adhered to said first electrically insulating layer with said electrically conductive pattern between said first and second electrically insulating layers;
   (e) forming connections to said pattern by
      (i) forming vias in said second electrically insulating layer extending to said pattern
      (ii) depositing conductive material into the vias to contact the electrically conductive pattern;
      (iii) depositing a patterned metal conductor layer onto the second electrically insulating layer and in contact with the conductive material within the vias;
      (iv) forming a metal bond pad over the patterned metal conductor layer; and
   (f) removing a portion of said substrate to divide said substrate into plural separated portions.

11. The method of claim 10 wherein said substrate is aluminum.

12. The method of claim 10 wherein said removal includes selectively etching away said aluminum substrate from the remaining structure thereon.

13. A method of forming an interconnect comprising the steps of:
   (a) providing a processing substrate;
   (b) adhering a first electrically insulating layer to said substrate;
   (c) forming an electrically conductive pattern on said first electrically insulating layer;
   (d) forming a second electrically insulating layer adhered to said first electrically insulating layer with said electrically conductive pattern between said first and second electrically insulating layers;
   (e) forming connections to said pattern including forming at least one via having walls in said second layer extending to said pattern having an electrically conductive material therein extending to said pattern; and
   (f) then removing said adhered first and second electrically insulating layers and said electrically conductive .pattern from
   said substrate to provide a freestanding film;
   (g) wherein step (e) includes forming a layer of copper over chromium on said walls of said at least one via and then forming a solder bump thereover extending out of said at least one via.

14. The method of claim 13 wherein said substrate is aluminum.

15. A method of forming an interconnect comprising the steps of:
   (a) providing a processing substrate;
   (b) adhering a first electrically insulating layer to said substrate;
   (c) forming an electrically conductive pattern on said first electrically insulating layer;
   (d) forming a second electrically insulating layer adhered to said first electrically insulating layer with said electrically conductive pattern between said first and second electrically insulating layers;
   (e) forming connections to said pattern including forming at least one via having walls in said second layer extending to said pattern having an electrically conductive material therein extending to said pattern; and
   (f) then removing said adhered first and second electrically insulating layers and said electrically conductive pattern from
   said substrate to provide a freestanding film;
   (g) wherein step (e) includes forming an electrically conductive region over and in contact with said pattern and disposed on said walls of said at least one via and then forming a bond pad over said electrically conductive region, said bond pad extending out of said at least one via.

16. The method of claim 15 wherein said electrically conductive region is formed by the step of plating of nickel contacting said conductive pattern and wherein said step of forming a bond pad includes the step of plating gold over said nickel.

* * * * *